(12) United States Patent
Ehben et al.

(10) Patent No.: US 6,310,494 B1
(45) Date of Patent: Oct. 30, 2001

(54) BUS DRIVER

(75) Inventors: Thomas Ehben, München; Thomas Steinecke, Hofsingelding; Dirk Römer; Thomas Künemund, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/243,831

(22) Filed: Feb. 1, 1999

(30) Foreign Application Priority Data

Jan. 30, 1998 (DE) .............................. 198 03 757

(51) Int. Cl.$^7$ .............................................. H03K 19/0175
(52) U.S. Cl. .................. 326/82; 326/86; 326/87
(58) Field of Search ................. 326/82, 86, 87, 326/93, 28

(56) References Cited

U.S. PATENT DOCUMENTS

| | | |
|---|---|---|
| 5,321,724 | 6/1994 | Long et al. . |
| 5,329,184 | 7/1994 | Redfern . |
| 5,390,140 | 2/1995 | Tomishima et al. . |
| 5,555,513 | 9/1996 | Harrington et al. . |
| 5,568,068 | * 10/1996 | Ota et al. ................. 326/82 |
| 5,804,987 | * 9/1998 | Ogawa et al. ........................ 326/40 |
| 5,804,990 | * 9/1998 | Popat et al. ............................ 326/114 |

FOREIGN PATENT DOCUMENTS 0 608 615 A2  8/1994 (EP) .

OTHER PUBLICATIONS

Japanese Patent Abstract No. 63 155 216 (Kazuhiro), dated Jun. 28, 1988.
Japanese Patent Abstract No.01 032523 (Makoto), dated Feb. 2, 1989.
Japanese Patent Abstract No. 02 250 526 (Nori), dated Oct. 8, 1990.
Japanese Patent Abstract No. 05 075 427 (Terumasa), dated Mar. 26, 1993.
"Secure Connection of Gigabits" (Wallenhorst), Electronics 15/1992, pp. 38–41.

* cited by examiner

*Primary Examiner*—Patrick Wamsley
*Assistant Examiner*—Anh Tran
(74) *Attorney, Agent, or Firm*—Herbert L. Lerner; Laurence A. Greenberg; Werner H. Stemer

(57) ABSTRACT

The invention relates to a bus driver having an inverter for driving a preferably clocked signal on a bus line. In the event of a capacitive coupling of the bus line to at least one neighboring bus line, a number of secondary inverters corresponding to the number of capacitively coupled bus lines are connected in parallel with the inverter of the bus driver. A simple logic combination supplies the necessary activating signals for the parallel connection of the secondary inverters. As a result, an additional secondary inverter can be connected in when an opposite edge occurs on a neighboring line for the instant of the edge. The invention consequently enables the driver intensity to be adapted dynamically to the signals of neighboring capacitively coupled bus lines.

9 Claims, 2 Drawing Sheets

BUS DRIVER

BACKGROUND OF THE INVENTION

FIELD OF THE INVENTION

The invention relates to a bus driver for driving a signal on a bus line which is capacitively coupled to at least one further bus line having further signals.

Capacitive coupling of neighboring bus lines frequently occurs during the operation of a bus. The capacitive coupling is undesirable and, in the worst case, can lead to interference with, and thus to alteration of, the signals driven on the bus lines. The worst case of capacitive coupling occurs when a signal on a neighboring bus line has an opposite timing edge to the signal to be driven. Owing to the undesirable capacitive coupling that may be expected, the signal to be driven must be amplified and thus adapted to the worst case of capacitive coupling. However, the amplification leads to unnecessarily fast timing edges of the signal to be driven. The fast timing edges are likewise undesirable, however, since they cause electromagnetic radiation, whereby neighboring components can be influenced in an interfering manner. In order to reduce the electromagnetic radiation and, consequently, in order to improve the electromagnetic compatibility (EMC), it is necessary, therefore to take measures for adaptation to the respective capacitive coupling of the bus lines.

To date, bus drivers of the generic type have typically been adapted to the worst case in the event of capacitive coupling with neighboring bus lines, that is to say to the case described above, when opposite timing edges occur on neighboring bus lines. However, this very rigid dimensioning, adapted to the worst case of capacitive coupling, is frequently not satisfactory either, since excessively great compensation takes place in the region outside the extreme case described above and excessively steep, fast timing edges are consequently produced. As a result, the electromagnetic radiation is maximized.

SUMMARY OF THE INVENTION

It is accordingly an object of the invention to provide a bus driver which overcomes the above-mentioned disadvantages of the prior art devices of this general type, whose driver intensity is dynamically adjustable.

With the foregoing and other objects in view there is provided, in accordance with the invention, in combination with a bus line capacitively coupled to at least one further bus line having further signals, a bus driver for driving a signal on the bus line, including: a compensation device that in an event of a change in the signal relative to at least one of the further signals, compensating for a deviation of the signal caused by the change.

According to the invention, the object is achieved by a bus driver of the generic type having a compensation device. The compensation device, in the event of a change in the signal relative to at least one of the further signals, compensates for the deviation of the signal caused by the change.

As a result of capacitive coupling, an interference signal may be superposed on a signal to be driven on the bus line of a bus. The interference signal may be caused for example by a further signal on at least one neighboring line. The neighboring line typically constitutes the two neighboring bus lines of the bus, but may also be formed by other neighboring signal lines that are capacitively coupled to the bus line. All that is essential in the case is that a relative signal change occurs between the signal to be driven and a signal on at least one of the neighboring lines. The compensation device according to the invention compensates for the interference signals by circuitry. In this way, the signal to be driven is not altered by interference signals that are coupled in.

Consequently, the present invention enables the bus driver intensity to be adapted dynamically to the signals of the neighboring capacitively coupled bus lines.

According to the invention, a number of secondary inverters can in this case be connected in parallel with the main inverter that drives the signal on the bus line. The number of secondary inverters typically corresponds to the number of neighboring bus lines capacitively coupled to the bus line.

In the case of an interference signal that is coupled in, at least one of the secondary inverters is connected in parallel with the main inverter for the purpose of compensating for the interference signals. The number of secondary inverters connected in results from the number of capacitively coupled neighboring bus lines. The secondary inverters generate a compensation signal that is superposed on the signal to be driven and thus compensates for the interference signal.

The invention is particularly advantageous if the signal to be driven on the bus line is clocked. Typically, the signals on the neighboring bus lines are then likewise clocked. The worst case arises when opposite timing edges of the driven clocked signals occur simultaneously on the bus line and on at least one of the neighboring bus lines. In the event of an opposite timing edge on one of the neighboring bus lines, one of the secondary inverters is connected in for the instant of the timing edge. In the event of an opposite edge on both neighboring bus lines, two secondary inverters are connected in. In the event that no opposite timing edges occur, the signal to be driven remains unchanged.

In this way, it is possible to set a defined, optimum edge steepness of the bus line signal. The optimum edge steepness is optimized with regard to optimum electromagnetic compatibility and also with regard to a maximum clock frequency of the bus system.

It is particularly advantageous if the secondary inverters can be connected in parallel with the main inverter via a controllable switch. The activation is effected in this case by an activating circuit. Consequently, each of the secondary inverters can be connected in with the inverter at the instant of the interference signal that occurs on the corresponding bus line. In a preferred embodiment, a controllable switch is also connected in series with the main inverter. In this way, the bus driver can likewise be inactivated. Bus drivers of this type that can be switched via a controllable switch are also referred to as "enableable" bus drivers.

To make it possible to identify a signal change on the bus lines, a memory for detecting signal changes is connected upstream of each bus driver of a bus line. In a typical and simple embodiment, the memory is realized by a simple flip-flop or a latch. The signal at the input or at the output of the memory is fed to an activating circuit. An activating signal can be tapped on the output of the activating circuit for each of the neighboring capacitively coupled bus lines, which activating signal is fed to the respective controllable switch of the respective secondary inverter. The activating signal characterizes the signal change between the signal to be driven relative to the signal of the corresponding neighboring bus line and thus an interference signal that is coupled in.

Other features which are considered as characteristic for the invention are set forth in the appended claims.

Although the invention is illustrated and described herein as embodied in a bus driver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
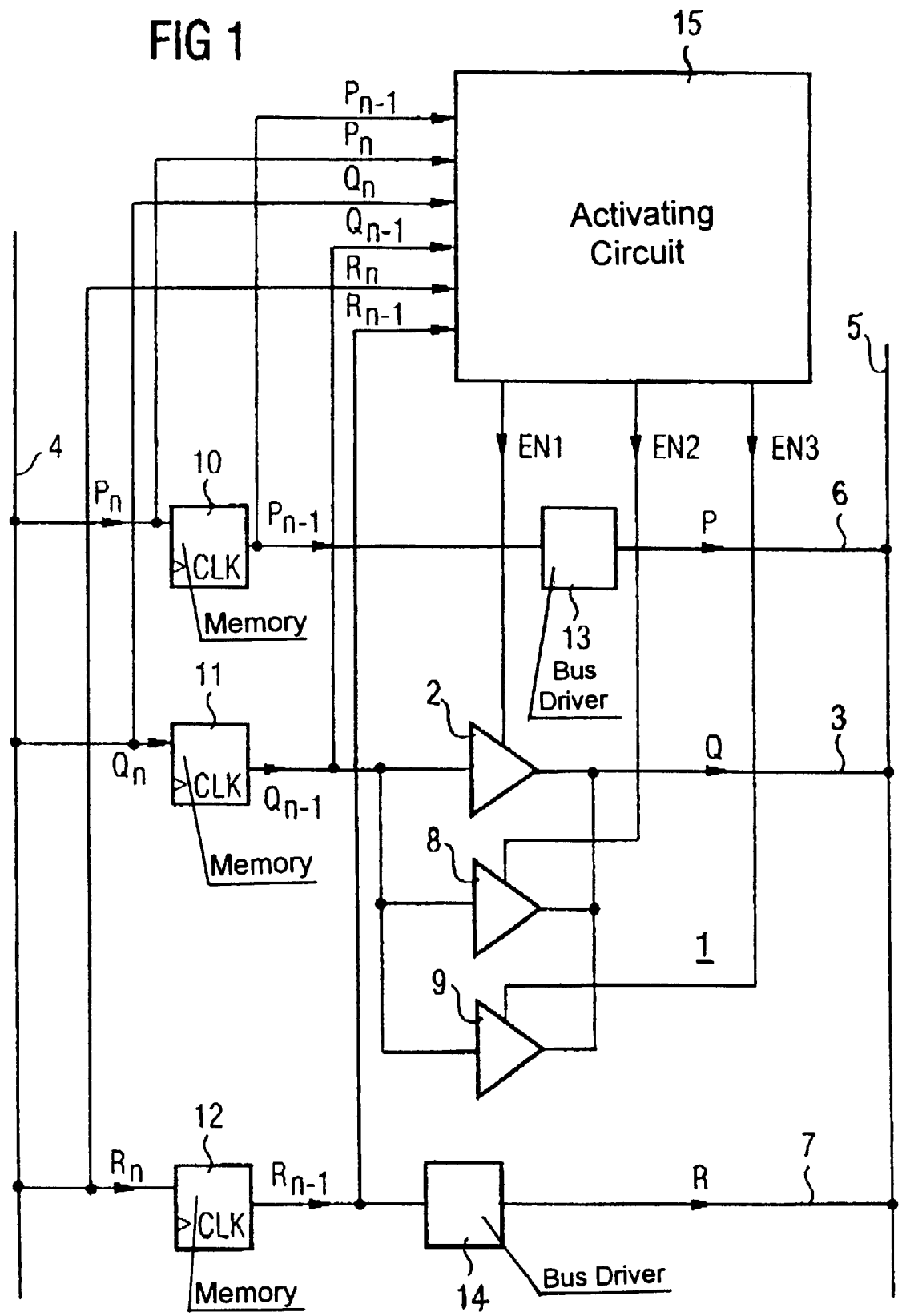
FIG. 1 is a diagrammatic block circuit diagram of a fundamental structure of a bus driver according to the invention.

In all the figures of the drawing, sub-features and integral parts that correspond to one another bear the same reference symbol in each case. Referring now to the figures of the drawing in detail and first, particularly, to FIG. 1 thereof, there is shown a fundamental structure of a bus driver 1 according to the invention, which has two neighboring, capacitively coupled bus lines in the present example.

The bus driver 1 includes an inverter 2 for driving a clocked bus signal Q on a main bus line 3 between a bus input 4 and a bus output 5. Two further bus lines 6, 7 are located in parallel with the main bus line 3 in the exemplary embodiment in FIG. 1, and the further bus lines 6, 7 are capacitively coupled to the main bus line 3. The further bus lines 6, 7 are likewise disposed between the bus input 4 and the bus output 5 and each include a further bus driver 13, 14. In the present example, the further bus drivers 13, 14 are constructed in a manner corresponding to the bus driver 1 and respectively drive further clocked bus signals P, R.

Two secondary inverters 8, 9 are disposed in parallel with the inverter 2 of the bus driver 1. The number of secondary inverters 8, 9 connected in parallel with the inverter 2 typically corresponds to the number of further bus lines 6, 7 capacitively coupled to the main bus line 3. A memory 11, 10, 12 is respectively connected upstream of each of the bus drivers 1, 13, 14. The memories 10, 11, 12 are each formed by an RS flip-flop in the present exemplary embodiment. The RS flip-flops 10, 11, 12 have in each case two inputs and in each case one output. Clocked signals Pn, Qn, Rn are coupled into the respective first input of the RS flip-flops 10, 11, 12 at the clock instant t=n. A system clock signal CLK is in each case coupled into the respective second input of the RS flip-flops 10, 11, 12. At the output, the clocked signal Pn−1, Qn−1, Rn−1 delayed by one cycle of the system clock signal CLK is available at the clock instant t=n−1 of the corresponding bus line 3, 6, 7.

An activating circuit 15 is additionally provided in FIG. 1. The respective clocked signals Pn, Qn, Rn and also the respective clocked signals Pn−1, Qn−1, Rn−1 delayed by one cycle are coupled into the activating circuit 15 on the input side. Three activating signals EN1, EN2, EN3 can be tapped on the output of the activating circuit 15. The inverters 2, 8, 9 can be connected in or disconnected by the activating signals EN1, EN2, EN3.

Figure 2:
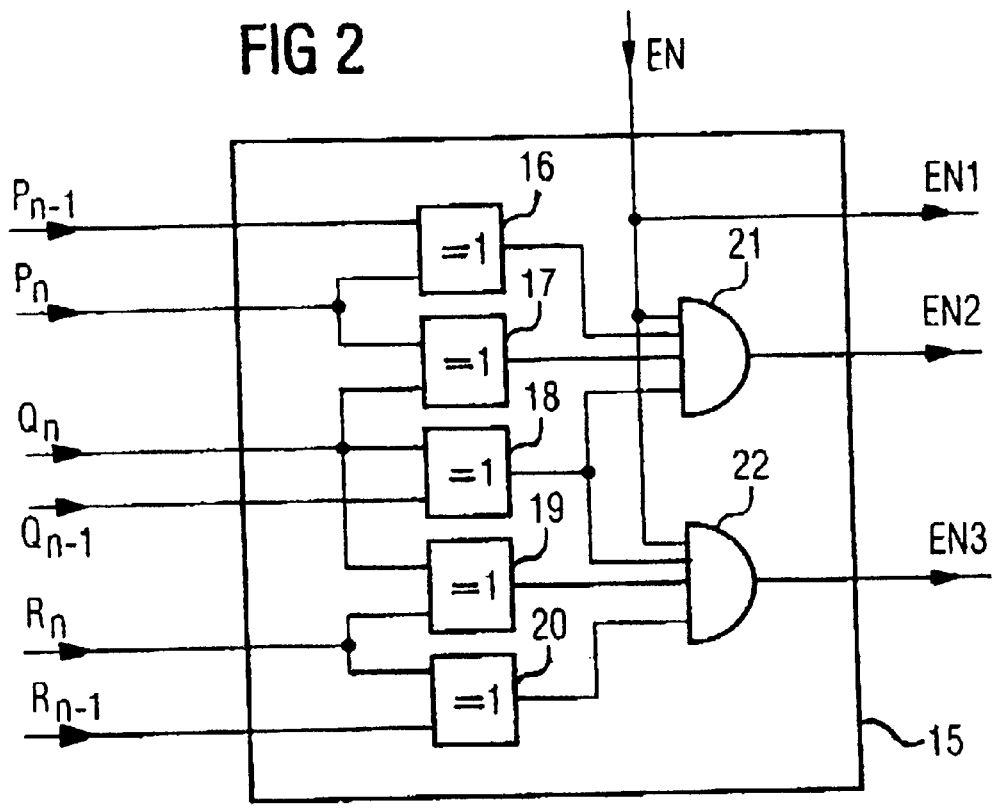
FIG. 2 is a circuit diagram of a circuit configuration of a preferred configuration of an activating circuit.

FIG. 2 shows the detailed structure of a preferred activating circuit 15 in accordance with FIG. 1. Identical or functionally identical elements are provided with the same reference symbols in accordance with FIG. 1.

The activating circuit 15 has six inputs for the coupling in of the clocked signals Pn, Qn, Rn and of the clocked signals Pn−1, Qn−1, Rn−1 delayed by one cycle for each of the bus lines 3, 6, 7. Furthermore, the activating circuit 15 has three outputs on which the three activating signals EN1, EN2, EN3 can be tapped. In the present exemplary embodiment, the activating circuit 15 contains a parallel circuit of five EXCLUSIVE-OR gates (XOR gates) 16 . . . 20. The signals Pn, Pn−1 are coupled into a first XOR gate 16. The signals Pn, Qn are coupled into a second XOR gate. The signals Qn, Qn−1 are coupled into a third XOR gate 18. The signals Qn, Rn are coupled into a fourth XOR gate 19. The signals Rn, Rn−1 are coupled into a fifth XOR gate.

Two AND gates 21, 22 connected in parallel, to which the output signals of the XOR gates 16 . . . 20 are fed, are connected downstream of the parallel circuit of XOR gates 16 . . . 20. In this case, the output signals of the first three XOR gates 16, 17, 18 are coupled into a first AND gate 21. The output signals of the third to fifth XOR gates 18, 19, 20 are coupled into a second AND gate 22. One of the activating signals EN2, EN3 can be respectively tapped on the output side of the two AND gates 21, 22.

In an advantageous configuration in accordance with FIG. 2, a further input may be provided, into which a so-called enable signal EN is coupled into the activating circuit 15. The enable signal EN is in this case fed to each of the two AND gates 21, 22. In addition, the enable signal EN is coupled out at a third output of the activating circuit 15 and then forms the activating signal EN1. Both the inverter 2 and the secondary inverters 8, 9 of the bus driver 1 can then be switched off by the enable signal EN. A bus driver of this type is usually referred to as an "enableable" driver.

Figure 3:
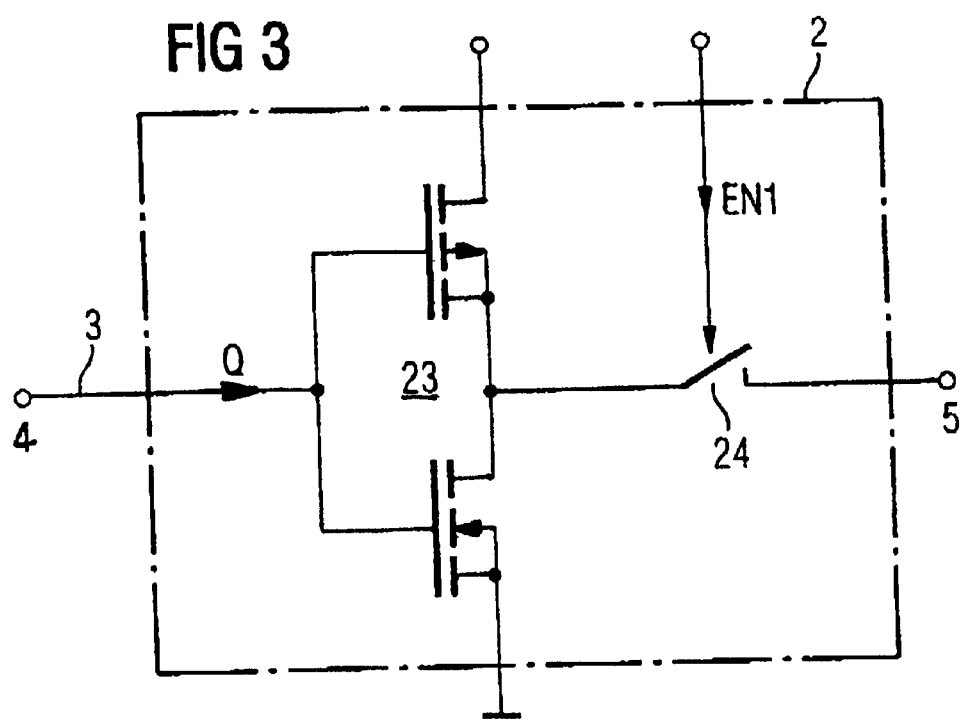
FIG. 3 is a circuit diagram of a circuit configuration of an inverter or secondary inverter.

A preferred embodiment of an inverter 2 is shown in FIG. 3. Identical or functionally identical elements are provided with the same reference symbols here.

The enableable inverter 2 of the bus driver 1 in this case has a CMOS inverter stage 23 disposed between the two poles of the supply voltage source. However, it would also be conceivable for the inverter stage 23 to be realized in bipolar fashion. Disposed between the center tap of the inverter stage 23 and the bus output 5 is a controllable switch 24, to which the activating signal EN1 is fed as a control signal. Consequently, the inverter 2 can be switched on and off via the controllable switch 24.

However, the invention is not restricted to the exemplary embodiment of the inverter 2 in accordance with FIG. 3 but rather can be applied to all types of bus drivers 1.

Typically, however, the secondary inverters 8, 9 are not necessarily constructed like the inverter 2.

In the present exemplary embodiment, the secondary inverters 8, 9 are connected in with the inverter 2 only when an opposite timing edge with respect to the bus line 3 occurs on one of the neighboring, capacitively coupled bus lines 6, 7. However, the present invention can be applied to any type of interference influence of signals on neighboring lines. The signals need not necessarily be clocked. In this case, however, the activating circuit 15 and also the memories 10, 11, 12 connected upstream of the inverters 2, 8, 9 would have to be adapted to this case and, consequently, be of more complex design in terms of circuitry.

The exemplary embodiment in accordance with FIG. 1 is based on two neighboring bus lines 6, 7 that are capacitively coupled to the bus line 3. Furthermore, the neighboring bus lines 6, 7 belong to the same bus as the bus line 3. However, this is not absolutely necessary. Rather, the present invention relates to a bus driver 1 for a bus line 3 which is capacitively coupled to any desired number of different signal lines not necessarily belonging to the same bus as the bus line 3. In this case, it must be possible in each case to connect in a secondary inverter in parallel with the inverter 2 of the bus driver 1 for each of the capacitively coupled signal lines.

The present invention is particularly advantageous for use in a bus driver of a microprocessor.

We claim:

1. In combination with a bus line capacitively coupled to at least one further bus line having further signals, a bus driver for driving a signal on the bus line, comprising:

a compensator compensating for a deviation of the signal caused by a change in the signal relative to at least one of the further signals.

2. The bus driver according to claim 1, including an inverter circuit for driving the signal, and said compensator having at least one secondary inverter connected in parallel with said inverter circuit.

3. The bus driver according to claim 2, wherein a number of said at least one secondary inverter corresponds to a number of further bus lines.

4. The bus driver according to claim 2, wherein at least the signal is clocked resulting in a clocked signal.

5. The bus driver according to claim 4, wherein said compensator corrects a defined edge gradient of said clocked signal if at least one of the further signals has a timing edge opposite to the signal.

6. The bus driver according to claim 4, wherein a number of timing edges of the further signals opposite to the signal defines a number of said at least one further secondary inverter connected in with said inverter circuit.

7. The bus driver according to claim 2, wherein at least one of said inverter circuit and said at least one secondary inverter has a controllable switch, and including an activating circuit for activating said controllable switch.

8. The bus driver according to claim 1, wherein at least one of the bus line and the at least one further bus line has a memory.

9. The bus driver according to claim 8, wherein said memory is a flip-flop.

* * * * *